US008790744B2

(12) United States Patent
Wang et al.

(10) Patent No.: US 8,790,744 B2
(45) Date of Patent: Jul. 29, 2014

(54) METHOD FOR MAKING NANOWIRE STRUCTURE

(75) Inventors: Jia-Ping Wang, Beijing (CN); Jia-Jia Wen, Beijing (CN); Qun-Feng Cheng, Beijing (CN); Kai-Li Jiang, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 797 days.

(21) Appl. No.: 12/589,469

(22) Filed: Oct. 23, 2009

(65) Prior Publication Data

US 2010/0124622 A1    May 20, 2010

(30) Foreign Application Priority Data

Nov. 14, 2008    (CN) .......................... 2008 1 0217816

(51) Int. Cl.
*C23C 18/00*    (2006.01)

(52) U.S. Cl.
USPC ........... 427/58; 427/126.3; 427/226; 977/746

(58) Field of Classification Search
None
See application file for complete search history.

(56) References Cited

U.S. PATENT DOCUMENTS

| 6,312,131 | B1 * | 11/2001 | Yamamoto et al. | 359/507 |
|---|---|---|---|---|
| 6,911,260 | B2 * | 6/2005 | Ren et al. | 428/408 |
| 7,045,108 | B2 * | 5/2006 | Jiang et al. | 423/447.2 |
| 7,294,366 | B2 * | 11/2007 | Renn et al. | 427/554 |
| 8,062,702 | B2 * | 11/2011 | Barron et al. | 427/213 |
| 2004/0047038 | A1 | 3/2004 | Jiang et al. | |
| 2004/0241532 | A1 | 12/2004 | Kim | |
| 2005/0058797 | A1 | 3/2005 | Sen et al. | |
| 2005/0208304 | A1 * | 9/2005 | Collier et al. | 428/403 |
| 2006/0285210 | A1 | 12/2006 | Hebrink et al. | |
| 2007/0161213 | A1 | 7/2007 | Hiura et al. | |
| 2007/0166223 | A1 | 7/2007 | Jiang et al. | |
| 2008/0170982 | A1 | 7/2008 | Zhang et al. | |
| 2008/0187684 | A1 | 8/2008 | Hu et al. | |
| 2008/0239489 | A1 | 10/2008 | Feng et al. | |
| 2008/0248235 | A1 | 10/2008 | Feng et al. | |
| 2008/0296537 | A1 * | 12/2008 | Gordon et al. | 252/506 |
| 2008/0299031 | A1 * | 12/2008 | Liu et al. | 423/447.3 |
| 2009/0008712 | A1 | 1/2009 | Choi et al. | |
| 2009/0075157 | A1 | 3/2009 | Pak et al. | |
| 2009/0075171 | A1 | 3/2009 | Feng et al. | |
| 2010/0117032 | A1 * | 5/2010 | Grigorian et al. | 252/507 |
| 2011/0183139 | A1 | 7/2011 | Grigorian et al. | |

FOREIGN PATENT DOCUMENTS

| CN | 1803586 A | 7/2006 |
|---|---|---|
| CN | 1910771 | 2/2007 |
| CN | 1304280 C | 3/2007 |
| CN | 101239712 | 8/2008 |
| CN | 101255544 | 9/2008 |
| CN | 101255590 | 9/2008 |
| CN | 101255591 A | 9/2008 |
| CN | 101259960 | 9/2008 |
| CN | 101311306 | 11/2008 |
| CN | 101314469 | 12/2008 |
| CN | 101348936 | 1/2009 |
| CN | 101372330 | 2/2009 |
| CN | 101388447 | 3/2009 |
| JP | 2001-146408 | 5/2001 |
| JP | 2004-59409 | 2/2004 |
| JP | 200459409 | 2/2004 |
| JP | 2007123657 | 5/2007 |
| JP | 2007-213859 | 8/2007 |
| JP | 2007-217194 | 8/2007 |
| JP | 2007-261867 | 10/2007 |
| JP | 2009-1481 | 1/2009 |
| JP | 2009-535294 | 10/2009 |
| JP | 2010-64925 | 3/2010 |
| TW | 200702479 | 1/2007 |
| TW | 200724486 | 7/2007 |
| WO | WO2005029528 | 3/2005 |
| WO | WO2008118533 | 10/2008 |

OTHER PUBLICATIONS

Hongtao et al. "Preparation and characterzation of aligned carbon nanotubes coated with titania nanoparticles". Chinese Science Bulletin. vol. 51 No. 18 pp. 2294-2296 (2006).*
Ajayan et al. "Carbon Nanotubes as Removable Templates for Metal Oxide Nanocomposites and Nanostructures". Nature vol. 375. pp. 564-567 (1995).*
Kim et al. "SiOx-sheathed carbon nanotubes prepared via a sputtering technique". Carbon vol. 45 (2007) pp. 2695-2716 in view of Ren US 6,911,260.*
Wilson et al. "Single Walled Carbon Nanotubes as Templates for Nanowire Conducting Probes". Nanoletters vol. 3 No. 10 2003 pp. 1365-1369.*
Ji et al. "Preparation of aligned titania nanowires with an aligned carbon nanotube composite template". Materials Letters 62 pp. 1979-1982, published online Nov. 2007.*
Watanabe et al. "Selective deposition of anatase and rutile films by KrF laser chemical vapor deposition from titanium isopropoxide". Thin Solid Films 406 (2002) pp. 132-137.*
A.Gomathi et al. "Chemically Bonded Ceramic Oxide Coatings on Carbon Nanotubes and Inorganic Nanowires", Advanced Materials, vol. 17, 2005, pp. 2757-2761.
H.Jiang et al."The preparation of stable metal nanoparticles on carbon nanotubes whose surfaces were modified during production", Carbon, vol. 45, 2007, pp. 655-661.
Dominik Eder et al."Morphology control of CNT-TiO2 hybrid materials and rutile nanotubes", J.Mater. Chem., vol. 18, 2008, pp. 2036-2043.
"Fabrication of Titania Nanofibers by Electrospinning", Dan Li et al., Nano Letters, vol. 3, No. 4 p. 555-560 (2003).
Weiqiang Han et al., "Synthesis of silicon nitride nanorods using carbon nanotubes as a template", Applied Physics Letters, American Institute of Physics, pp. 2271-2273, Oct. 20, 1997.
Joshua M. Green et al., ZnO-nanoparticle-coated carbon nanotubes demonstrating enhanced electron field-emission properties, J. Appl. Phys. 99, 094308 (2006).

* cited by examiner

*Primary Examiner* — Dah-Wei D Yuan
*Assistant Examiner* — Jose Hernandez-Diaz
(74) *Attorney, Agent, or Firm* — Novak Druce Connolly Bove + Quigg LLP

(57) ABSTRACT

The disclosure related to a method for making a nanowire structure. The method includes fabricating a free-standing carbon nanotube structure, introducing reacting materials into the carbon nanotube structure, and activating the reacting materials to grow a nanowire structure.

17 Claims, 17 Drawing Sheets

METHOD FOR MAKING NANOWIRE STRUCTURE

RELATED APPLICATIONS

This application claims all benefits accruing under 35 U.S.C. §119 from China Patent Application No. 200810217816.4, filed on Nov. 14, 2008 in the China Intellectual Property Office. This application is related to applications entitled "NANO-MATERIALS", filed on Oct. 23, 2009 with U.S. patent application Ser. No. 12/589,493; "COMPOSITE MATERIAL", filed on Oct. 23, 2009 with U.S. patent application Ser. No. 12/589,470; "METHOD FOR MAKING COMPOSITE MATERIAL", filed on Nov. 25, 2009 with U.S. patent application Ser. No. 12/592,497; "CARBON NANOTUBE COMPOSITE AND METHOD FOR FABRICATING THE SAME", filed on 2009 Aug. 13.

BACKGROUND

1. Technical Field

The disclosure relates to methods for making nanowire structure, and particularly to a method using CNT structure as template for making nanowire structure.

2. Description of Related Art

Many novel properties are beyond traditional theories of material science and properties when the materials are at a nanoscale. Nanomaterial has become representative of modern science and technology and future research because of their distinct catalytic reaction, electrical, physical, magnetic, and luminescent properties. Methods have been developed to manufacture nanomaterial, including spontaneous growth, template-based synthesis, electrospinning, and lithography.

A titanium dioxide nanofiber can be fabricated via an electrospinning method. A mixture of titanium-tetraisopropoxide (TTIP) and poly vinylpyrrolidone (PVP) in an alcohol medium utilized as a sol-gel solution was injected through a needle under a strong electrical field. Composite titanium dioxide nanofiber made of PVP and amorphous titanium dioxide were formed (with lengths up to several centimeters) as a result of electrostatic jetting. Both supported and free-standing mats consisting of titanium dioxide nanofiber has been successfully fabricated. However, the electrospinning method for fabricating titanium dioxide nanofibers requires high voltage, which is costly, and requires complicated equipment to carry out.

Carbon nanotubes (CNTs) have a high Young's modulus, high thermal conductivity, and high electrical conductivity, among other properties, making them an ideal template to synthesize nanomaterial by template-based synthesis.

A template-based synthesis method to synthesize silicon nitride nanowire in high yield uses CNT powders as templates. In this method, Si powders and nano $SiO_2$ powders are mixed in a given proportion to form a mixed powder. The mixed powder is put on the bottom of a dual-layer corundum boat and some CNT powders on the top of the boat. The boat is then put into a high temperature furnace for reduction and nitridation to grow silicon nitride nanowire on the surface of the CNT powders. During this process, Si reacts with $SiO_2$ to form silicon oxide (SiO) vapor, and the SiO vapor reacts with nitrogen gas to form silicon nitride nanowire having diameters and lengths similar to those of the CNT powders.

However, the nanowire fabricated based on the template of the CNT powders, has a relatively short length because the diameters and lengths of the CNT powders are short. Moreover, the CNT powders utilized as the template are prone to agglomerate. As such, the nanowires cannot be well dispersed and cannot have a fixed shape. Additionally, the nanowires are synthesized by this method without a free-standing structure, thereby limiting its application.

What is needed, therefore, is a method for fabricating a free-standing nanowire structure using a CNT structure as a template.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments.

Figure 1:
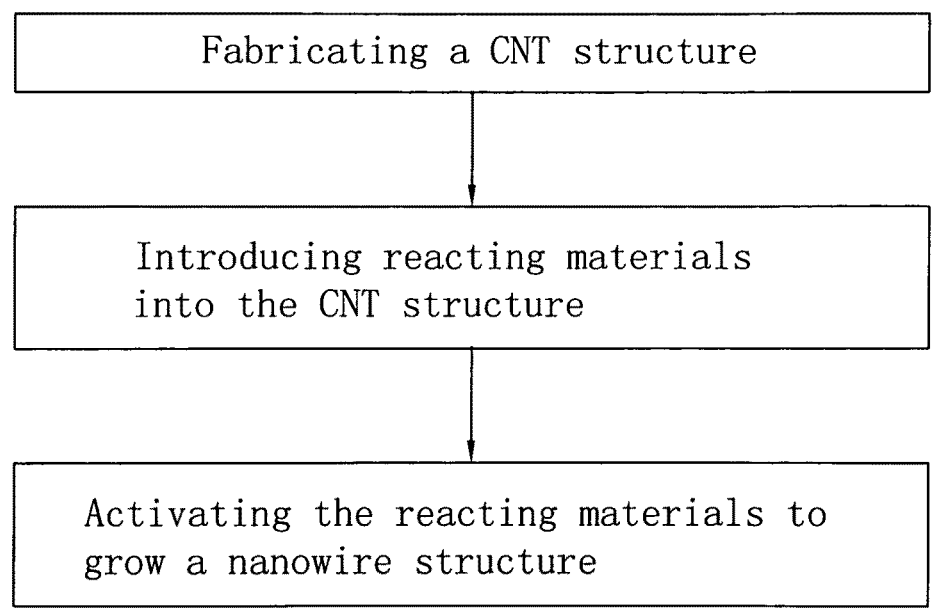
FIG. 1 is a flow chart of one embodiment of a method for fabricating a nanowire structure.

Corresponding reference characters indicate corresponding parts throughout the several views. The exemplifications set out herein illustrate at least one embodiment of the present nanowire structure, in one form, and such exemplifications are not to be construed as limiting the scope of the invention in any manner.

DETAILED DESCRIPTION

Referring to FIG. 1, one embodiment of a method for making a nanowire structure includes (1) providing a free-standing carbon nanotube structure, (2) introducing at least two types reacting materials into the carbon nanotube structure, and (3) activating the reacting materials to grow a nanowire structure.

Method for Step 1

In step (1), the free-standing carbon nanotube structure can maintain a certain shape without a supporter, which is different from a powder or liquid. The carbon nanotube structure includes a plurality of carbon nanotubes adhered to each other by van der Waals attractive force therebetween, thereby forming a certain shape. The carbon nanotube structure is made of a plurality of pure carbon nanotubes. The carbon nanotubes can be arranged in an orderly or disorderly arrangement. The carbon nanotubes in the carbon nanotube structure can be single-walled, double-walled, or multi-walled carbon nanotubes. A diameter of each single-walled carbon nanotube ranges from about 0.5 nanometers (nm) to about 50 nm. A diameter of each double-walled carbon nanotube ranges from about 1 nm to about 50 nm. A diameter of each multi-walled carbon nanotube ranges from about 1.5 nm to about 50 nm. The length of each carbon nanotube is greater than 50 micrometers (μm). In one embodiment, the length of the carbon nanotubes ranges from about 200 μm to 900 μm.

The carbon nanotube structure can be a carbon nanotube film structure with a thickness ranging from about 0.5 nm to about 1 mm. The carbon nanotube film structure can include at least one carbon nanotube film. The carbon nanotube structure can also be a linear carbon nanotube structure with a diameter ranging from about 0.5 nm to about 1 mm. The carbon nanotube structure can also be a combination of the carbon nanotube film structure and the linear carbon nanotube structure. It is understood that any carbon nanotube structure described can be used with all embodiments.

Drawn Carbon Nanotube Film

Figure 2:
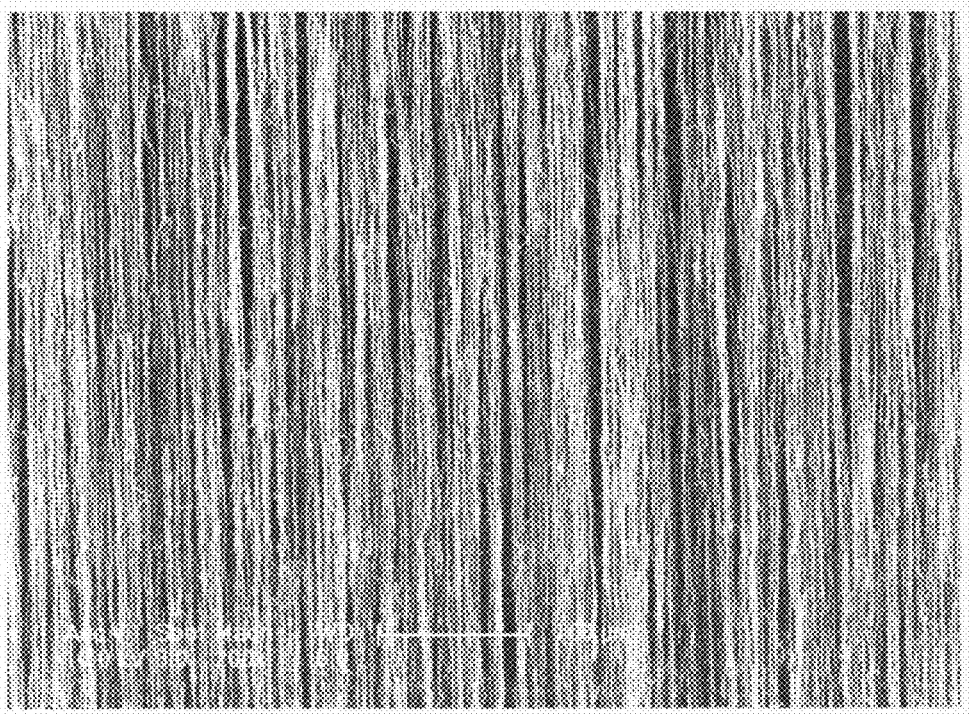
FIG. 2 shows a Scanning Electron Microscope (SEM) image of an aligned carbon nanotube film.
Figure 3:
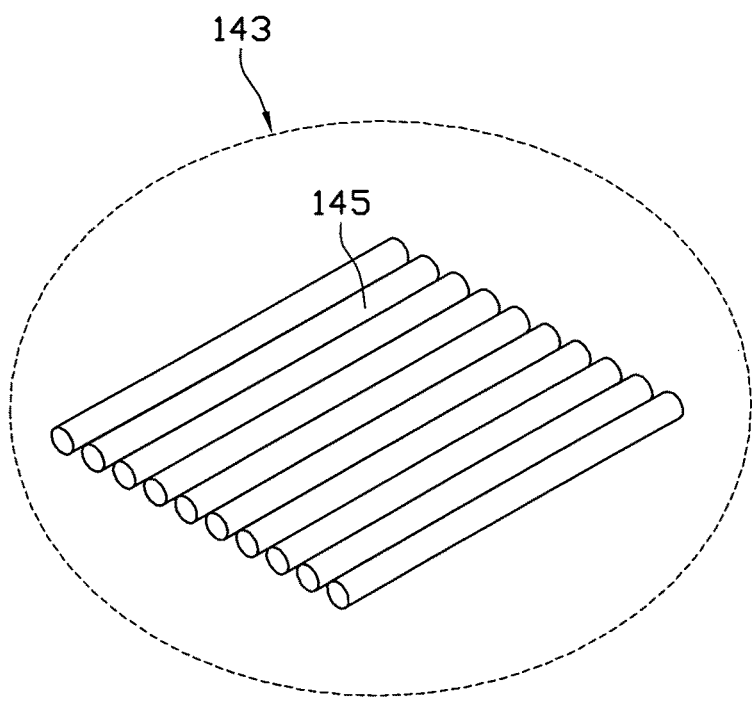
FIG. 3 is a schematic structural view of a carbon nanotube segment.

In one embodiment, the carbon nanotube film structure includes at least one drawn carbon nanotube film. A film can be drawn from a carbon nanotube array to form a drawn carbon nanotube film. Examples of drawn carbon nanotube film are taught by U.S. Pat. No. 7,045,108 to Jiang et al., and WO 2007015710 to Zhang et al. The drawn carbon nanotube film includes a plurality of successive and oriented carbon nanotubes joined end-to-end by van der Waals attractive force therebetween. The drawn carbon nanotube film is a free-standing film. Referring to FIGS. 2 and 3, each drawn carbon nanotube film includes a plurality of successively oriented carbon nanotube segments 143 joined end-to-end by van der Waals attractive force therebetween. Each carbon nanotube segment 143 includes a plurality of carbon nanotubes 145 parallel to each other, and adhered to each other by van der Waals attractive force therebetween. The carbon nanotubes 145 in the drawn carbon nanotube film are oriented along a preferred orientation. The carbon nanotube film can be treated with an organic solvent to increase the mechanical strength and toughness of the carbon nanotube film and reduce the coefficient of friction of the carbon nanotube film. A thickness of the carbon nanotube film can range from about 0.5 nm to about 100 μm.

A method of making a drawn carbon nanotube film includes the steps of providing an array of carbon nanotubes and pulling out a drawn carbon nanotube film from the array of carbon nanotubes. Pulling can be aided by the use of a tool such as adhesive tape, pliers, tweezers, or other tools allowing multiple carbon nanotubes to be gripped and pulled simultaneously.

The drawn carbon nanotube film can be formed by the substeps of selecting one or more carbon nanotubes having a predetermined width from the array of carbon nanotubes and pulling the carbon nanotubes at a uniform speed to form carbon nanotube segments that are joined end to end to achieve a uniform drawn carbon nanotube film.

The carbon nanotube segments can be selected by using the tool that allows multiple carbon nanotubes to be gripped and pulled simultaneously to contact with the array of carbon nanotubes. The pulling direction can be substantially perpendicular to the growing direction of the array of carbon nanotubes.

More specifically, during the pulling process, as the initial carbon nanotube segments are drawn out, other carbon nanotube segments are also drawn out end to end due to van der Waals attractive force between ends of adjacent segments. This pulling process produces a substantially continuous and uniform carbon nanotube film having a predetermined width.

The carbon nanotube film structure can include at least two stacked carbon nanotube films. In other embodiments, the carbon nanotube structure can include two or more coplanar carbon nanotube films, and can include layers of coplanar carbon nanotube films. Additionally, when the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films can be adhered to each other by only the van der Waals attractive force therebetween. However as the thickness of the carbon nanotube structure increases, the specific surface area decreases. An angle between the aligned directions of the carbon nanotubes in two adjacent carbon nanotube films can range from about 0 degrees to about 90 degrees. When the angle between the aligned directions of the carbon nanotubes in adjacent carbon nanotube films is larger than 0 degrees, a microporous structure is defined by the carbon nanotubes. The carbon nanotube structure in an embodiment employing these films will have a plurality of micropores. The micropore has a diameter which can range from about 1 nm to about 0.5 μm. Stacking the carbon nanotube films will also add to the structural integrity of the carbon nanotube structure.

Flocculated Carbon Nanotube Film

Figure 8:
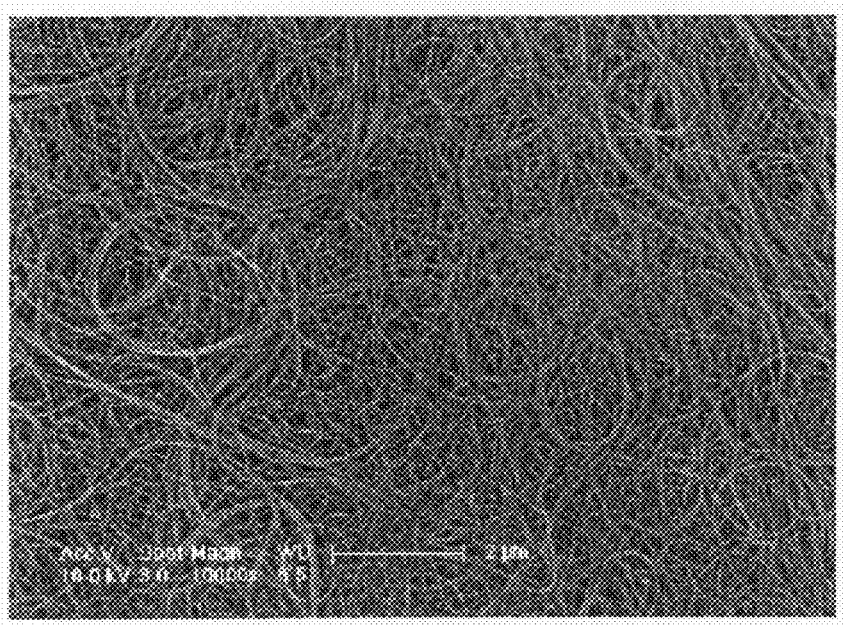
FIG. 8 is a Scanning Electron Microscope (SEM) image of a flocculated CNT film with carbon nanotubes entangled with each other therein.

In another embodiment, the carbon nanotube film structure includes a flocculated carbon nanotube film. Referring to FIG. 8, the flocculated carbon nanotube film can include a plurality of long, curved, disordered carbon nanotubes entangled with each other. Further, the flocculated carbon nanotube film can be isotropic. The carbon nanotubes can be substantially uniformly dispersed in the carbon nanotube film. Adjacent carbon nanotubes are acted upon by van der Waals attractive force to form an entangled structure with micropores defined therein. It is understood that the flocculated carbon nanotube film is very porous. Sizes of the micropores can be less than 10 μm. The porous nature of the flocculated carbon nanotube film will increase the specific surface area of the carbon nanotube structure. Further, since the carbon nanotubes in the carbon nanotube structure are entangled with each other, the carbon nanotube structure employing the flocculated carbon nanotube film has excellent durability, and can be fashioned into desired shapes with a low risk to the integrity of the carbon nanotube structure.

The flocculated carbon nanotube film can be executed by providing carbon nanotubes, flocculating the carbon nanotubes in a solvent to acquire a carbon nanotube flocculated structure, separating the carbon nanotube flocculated structure from the solvent, and shaping the separated carbon nanotube flocculated structure into the flocculated carbon nanotube film in which the carbon nanotubes are entangled with each other and isotropic.

Pressed Carbon Nanotube Film

Figure 6:
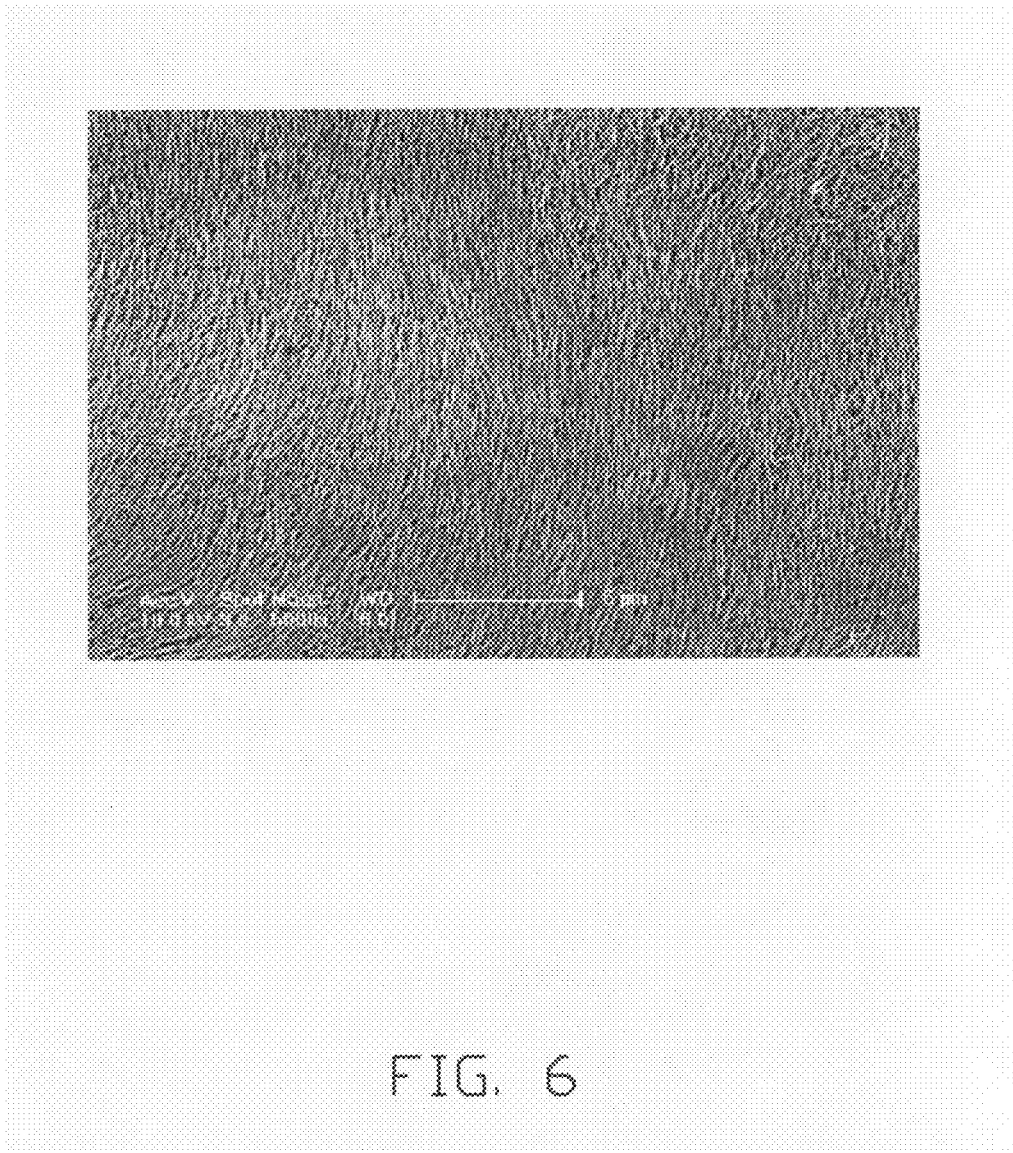
FIG. 6 is a Scanning Electron Microscope (SEM) image of a pressed CNT film of CNT structure, wherein the CNTs of the pressed CNT film are arranged along a same direction.
Figure 7:
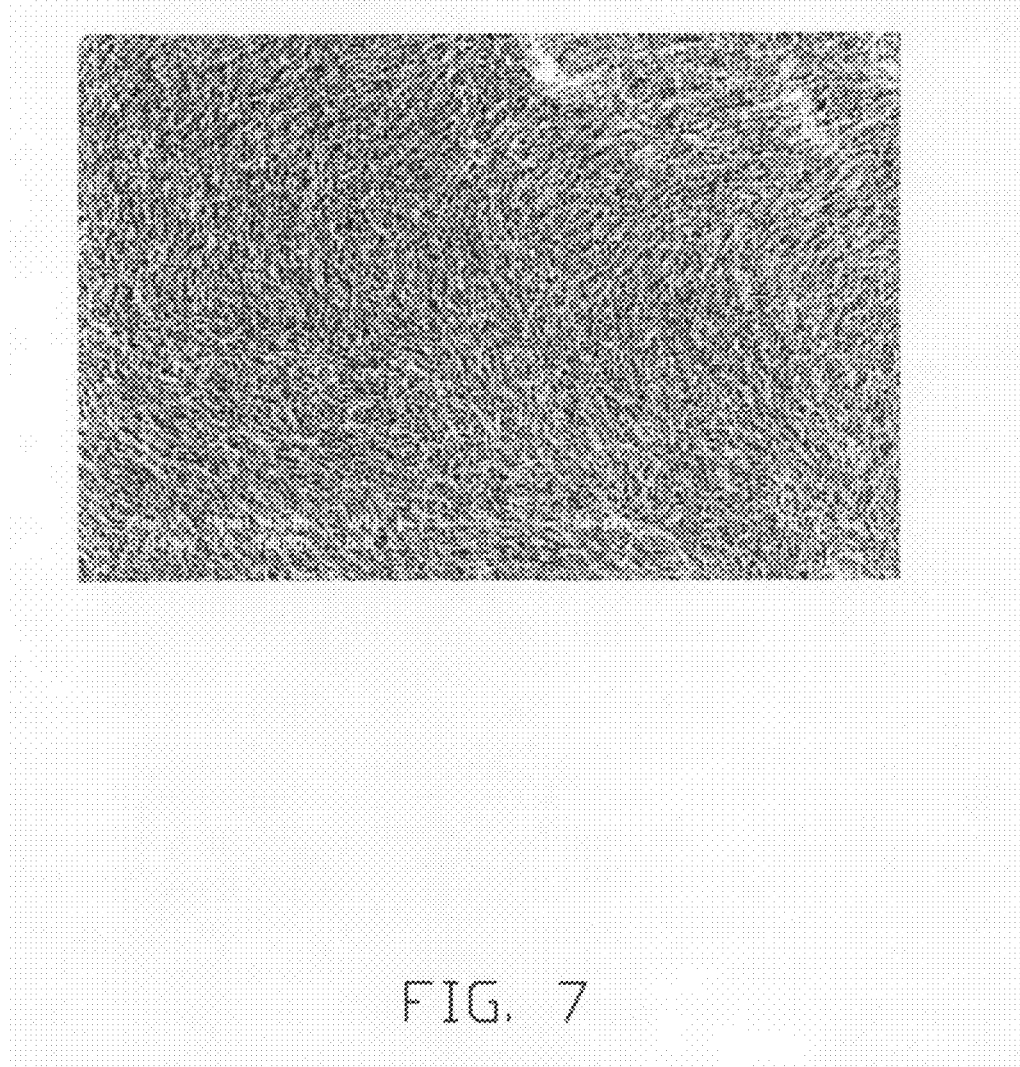
FIG. 7 is a Scanning Electron Microscope (SEM) image of a pressed CNT film of CNT structure, wherein the CNTs of the pressed CNT film are arranged along different directions.

In another embodiment, the carbon nanotube film structure can include at least one pressed carbon nanotube film. Referring to FIGS. 6 and 7, the pressed carbon nanotube film can be a free-standing carbon nanotube film. The carbon nanotubes in the pressed carbon nanotube film can be arranged along a same direction (see FIG. 6) or arranged along different directions (see FIG. 7). The carbon nanotubes in the pressed carbon nanotube film can rest upon each other. Adjacent carbon nanotubes are attracted to each other and adhered to each other by van der Waals attractive force. An angle between a primary alignment direction of the carbon nanotubes and a surface of the pressed carbon nanotube film is about 0 degrees to about 15 degrees. The greater the pressure applied, the smaller the angle formed. When the carbon nanotubes in the pressed carbon nanotube film are arranged along different directions, the carbon nanotube structure can be isotropic. The thickness of the pressed carbon nanotube film ranges from about 0.5 nm to about 1 mm. Examples of pressed carbon nanotube film are taught by US application 20080299031A1 to Liu et al.

The pressed carbon nanotube film can be executed by providing an array of carbon nanotubes formed on a substrate and providing a pressing device to press the array of carbon nanotubes, thereby forming the pressed carbon nanotube film.

Linear Carbon Nanotube Structure

In other embodiments, the linear carbon nanotube structure includes carbon nanotube wires and/or carbon nanotube cables.

Figure 4:
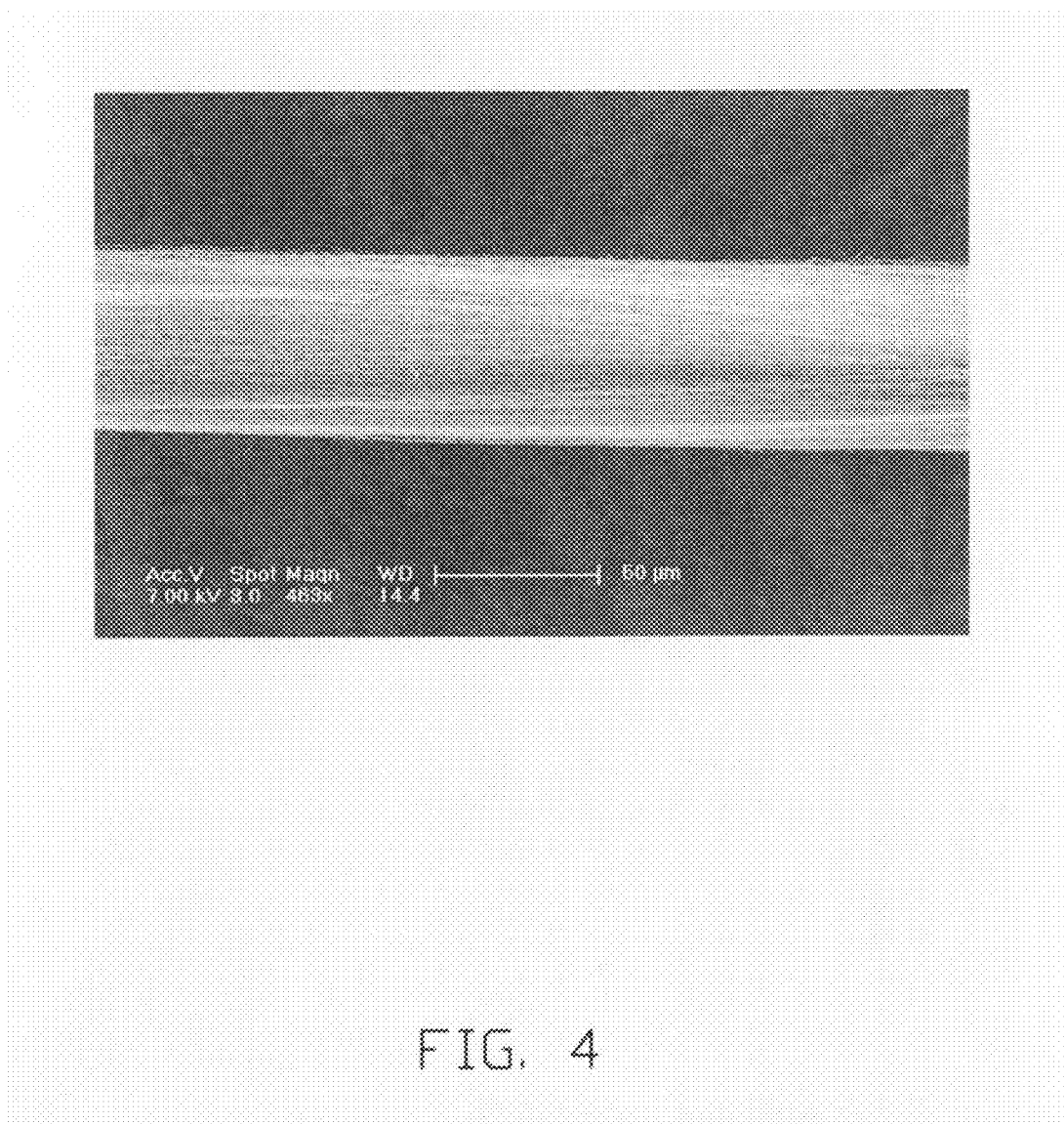
FIG. 4 is a Scanning Electron Microscope (SEM) image of an untwisted carbon nanotube wire.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During the soaking, adjacent parallel carbon nanotubes in the drawn carbon nanotube film will bundle together, due to the surface tension of the organic solvent as it volatilizes. The drawn carbon nanotube film will shrink into untwisted carbon nanotube wire. Referring to FIG. 4, the untwisted carbon nanotube wire includes a plurality of carbon nanotubes substantially oriented along a same direction (i.e., a direction along the length of the untwisted carbon nanotube wire). The carbon nanotubes are substantially parallel to the axis of the untwisted carbon nanotube wire. More specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and adhered to each other by van der Waals attractive force therebetween. The carbon nanotube segments can vary in width, thickness, uniformity, and shape. Length of the untwisted carbon nanotube wire can be arbitrarily set as desired. A diameter of the untwisted carbon nanotube wire ranges from about 0.5 nm to about 100 µm.

Figure 5:
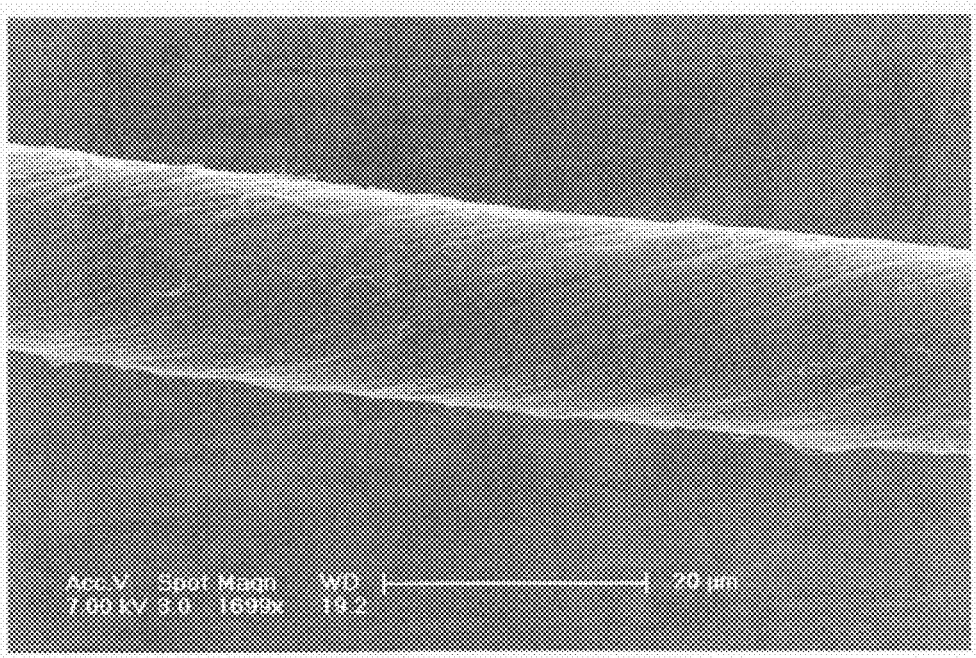
FIG. 5 is a Scanning Electron Microscope (SEM) image of a twisted carbon nanotube wire.

The twisted carbon nanotube wire can be formed by twisting a drawn carbon nanotube film using a mechanical force to turn the two ends of the drawn carbon nanotube film in opposite directions. Referring to FIG. 5, the twisted carbon nanotube wire includes a plurality of carbon nanotubes helically oriented around an axial direction of the twisted carbon nanotube wire. More specifically, the twisted carbon nanotube wire includes a plurality of successive carbon nanotube segments joined end to end by van der Waals attractive force therebetween. Each carbon nanotube segment includes a plurality of carbon nanotubes substantially parallel to each other, and adhered to each other by van der Waals attractive force therebetween. Length of the carbon nanotube wire can be set as desired. A diameter of the twisted carbon nanotube wire can be from about 0.5 nm to about 100 µm. Further, the twisted carbon nanotube wire can be treated with a volatile organic solvent after being twisted. After being soaked by the organic solvent, the adjacent carbon nanotubes in the twisted carbon nanotube wire will bundle together, due to the surface tension of the organic solvent when the organic solvent volatilizes. The specific surface area of the twisted carbon nanotube wire will decrease, while the density and strength of the twisted carbon nanotube wire will be increased.

The carbon nanotube cable includes two or more carbon nanotube wires. The carbon nanotube wires in the carbon nanotube cable can be twisted or untwisted. In an untwisted carbon nanotube cable, the carbon nanotube wires are substantially parallel with each other. In a twisted carbon nanotube cable, the carbon nanotube wires are twisted with each other.

Edges of the carbon nanotube structure can be adhered to a supporter, such as a frame or a substrate such that a center portion of the carbon nanotube structure is suspended on the supporter.

Method for Step 2

In step (2), the reacting materials can be solid, liquid or gaseous. There are three methods to execute step (2).

The first method for introducing at least two types of reacting materials into the carbon nanotube structure includes (2a1) introducing a first reacting material to form a first reacting material layer on the surface of the carbon nanotube structure, and (2a2) introducing a second reacting material to the carbon nanotube structure.

In step (2a1), the thickness of the first reacting material layer is about 50 nm to about 200 nm. The first reacting material can be metal, non-metal, semiconductor, and any combination thereof as desired. In one embodiment, the first reacting material is metal, for example, titanium (Ti), aluminum (Al), or nickel (Ni), and a metal compounds nanowire structure, for example, metal oxide or metal silicides nanowire structure, can be obtained by introducing the first reacting material. In one embodiment, the first reacting material is silicon, and a non-metal compounds nanowire structure, for example, silicon nitride or silicon carbide nanostructure can be obtained by introducing the first reacting material.

The method for forming the first reacting layer can be chemical vapor deposition (CVD), physical vapor deposition (PVD), impregnation method, spraying method, or silk-screen printing method. The metal or metal oxide can be sputtered on the surface of the carbon nanotube structure by the PVD method. The non-metallic nitride or carbide can be formed on the surface of the carbon nanotube structure by the CVD method. The metal organic solution can be formed on the surface of the carbon nanotube structure by impregnation, spraying, or silk-screen printing. Part or all the surface of the carbon nanotube structure can be coated with the first reacting materials.

In step (2a2), the second reacting material can be liquid or gaseous. The gaseous second reacting material can be oxygen gas, nitrogen gas, silicon source gas and carbon source gas, and any combination thereof. The method of introducing the gaseous second reacting material can be by directly introducing the gaseous second reacting material into a chamber having a carbon nanotube structure deposited thereon. The gaseous second reacting material is distributed on the surroundings of the carbon nanotube structure and the first reacting material.

When the second reacting material is liquid, it can be methanol, ethanol, acetone, liquid resin, and any combination thereof. The method of introducing the liquid second reacting material can be by directly dropping the liquid second reacting material on the surface of the carbon nanotube structure or immersing the carbon nanotube structure in the liquid reacting material. The liquid second reacting material is distributed on the surroundings of the carbon nanotube structure and the first reacting material.

The second method for introducing the at least two types reacting materials into the carbon nanotube structure includes (2b1) forming a first reacting material layer on the surface of the carbon nanotube structure, and (2b2) forming a second reacting material layer on the surface of the first reacting material layer. The total thickness of the first and the second reacting material layers is about 50 nm to about 200 nm. In one embodiment, the first reacting material layer is a metal layer, for example, Al and Ti layer. The second reacting material layer is a silicon layer. In one embodiment, the first and the second reacting layer are metal layers, for example, Al and Ti layer, or Al and Ni layer.

The third method for introducing the at least two types reacting materials into the carbon nanotube structure includes simultaneously introducing two gaseous reacting materials, two liquid reacting materials, or a combination of one gaseous reacting material and one liquid reacting material.

In one embodiment, a Ti layer is deposited on the surface of the carbon nanotube structure by a magnetron sputtering method. The carbon nanotube structure with the Ti layer is exposed to the atmosphere, thus a sufficient contact is formed between the Ti particles on the surface of the carbon nanotube structure and the oxygen gas in the atmosphere. When the thickness of the Ti layer reaches about 50 nm to about 100 nm, a plurality of successive titanium dioxide ($TiO_2$) nanowires is formed after the reaction of the Ti layer and the oxygen gas. When the thickness of the Ti layer is less than 50 nm, a plurality of spaced $TiO_2$ particles is prone to be formed.

Method for Step 3

In step (3), the reacting materials are activated to grow a nanowire structure. The methods of activating the reaction materials can be heating, laser scanning, reactive sputtering, and any combination thereof. The gas containing silicon source and carbon source is activated to grow silicon carbide nanowire structure by the heating method. The metal and oxygen gas are activated to grow metallic oxide nanowire structure by a laser irradiating method. Vacuum sputtering of metal particles simultaneously allows access to oxygen gas to grow metal oxide nanowire structure.

In one embodiment, the laser scanning is used to cause the reacting materials to react. When the total surface of the carbon nanotube structure is scanned via the laser scanning method, the reacting materials on the surface of the carbon nanotube structure can be reacted. When a part of the surface of the carbon nanotube structure is scanned via the laser scanning method, the reacting materials on the surface of the carbon nanotube structure diffuse along the arrangement of the carbon nanotubes from the position where the laser is scanning.

When the part of the surface of the carbon nanotube structure is scanned, the carbon nanotube structure can be arranged on a substrate. The larger the heat transfer coefficient, the faster the heat transfers toward the substrate, and the slower the growth speed of the carbon nanotube structure. When the carbon nanotube structure is suspended on the frame, the carbon nanotube structure has a fast speed because of a small thermal conductivity of the air.

Nanowire structure coats on the surface of the carbon nanotube structure and grows along the length direction of the carbon nanotubes of the carbon nanotube structure. The nanowire structure is free-standing because the carbon nanotube structure utilized as the template is free-standing. The drawn carbon nanotube film includes a plurality of successively oriented carbon nanotubes joined end-to-end by van der Waals attractive force therebetween. The carbon nanotubes of the drawn carbon nanotube film are substantially parallel to each other and adhered to each other by van der Waals attractive force therebetween. As such, the nanowires of the nanowire structure are substantially parallel to each other. The length of the nanowire structure is equal to a length of the drawn carbon nanotube film which is arbitrarily set as desired. The pressed carbon nanotube film has a plurality of carbon nanotubes aligned along a fixed direction or along different directions. As such, the nanowires of the nanowire structure are arranged along a same direction or arranged along different directions. The flocculated carbon nanotube film includes a plurality of carbon nanotubes entangled with each other. As such, the nanowires of the nanowire structure are entangled with each other.

The nanowire structure can be separated from the carbon nanotube structure. The method of separating the nanowire structure from the carbon nanotube structure depends on the material of the nanowire structure. The carbon nanotube structure can be removed to form the non-metallic nitrides nanowire structure and metallic oxide nanowire structure by a high-temperature oxidation process. In one embodiment, the carbon nanotube structure is removed at a temperature of about 500° C. to about 1000° C. for about 1 hour to about 4 hours.

Example 1

Method for Manufacturing TiO2 Nanowires

Figure 9:
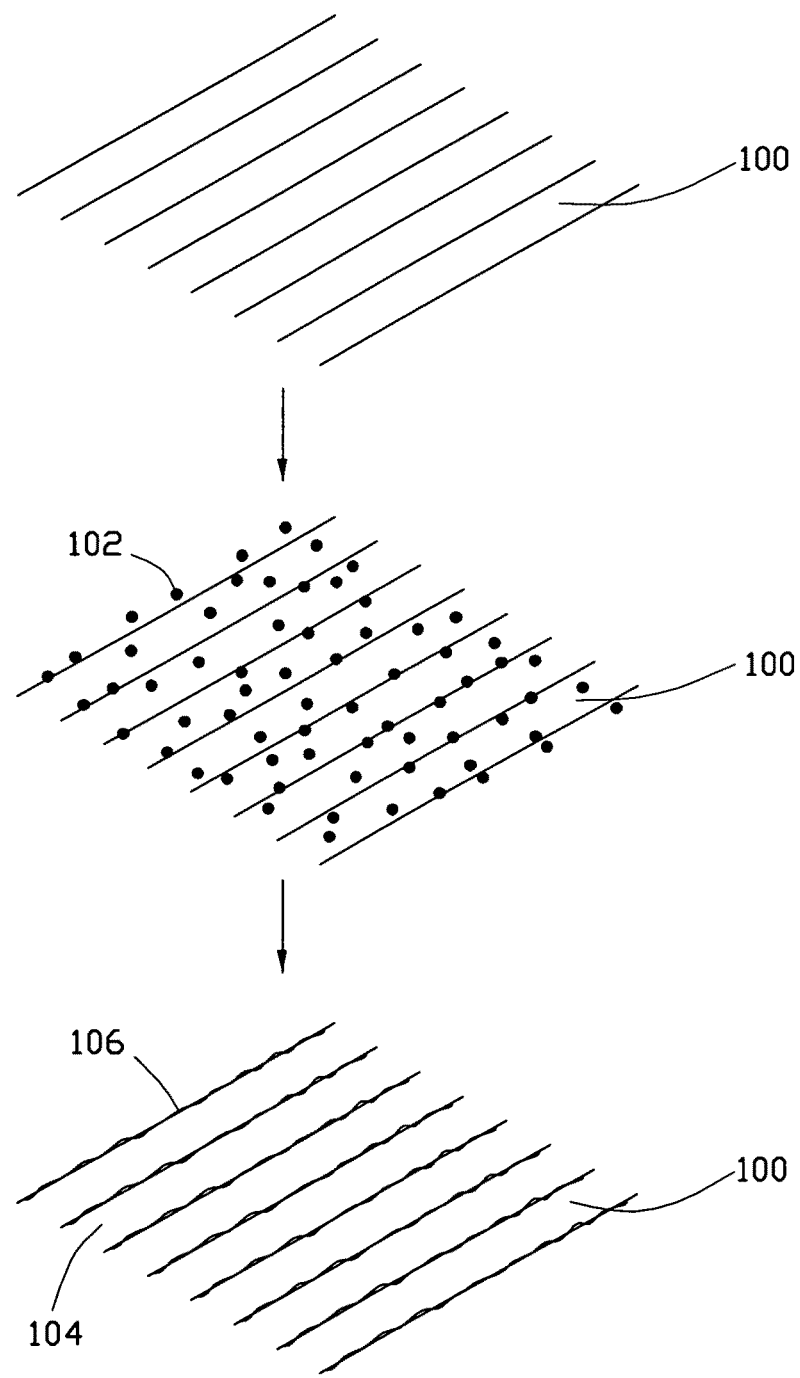
FIG. 9 shows a first embodiment of a method for fabricating a nanowire structure.

Referring to FIG. 9, in a first embodiment, a method of fabricating a $TiO_2$ nanowire structure 104 includes (a1) providing a two dimension carbon nanotube structure 100, (a2) introducing reacting materials 102 into the carbon nanotube structure 100, and (a3) activating the reacting materials 102 to grow the $TiO_2$ nanowires structure 104.

In step (a1), the two dimension carbon nanotube structure 100 is obtained by stacking two drawn carbon nanotube films. The carbon nanotubes of the drawn carbon nanotube film are oriented substantially along the same direction.

Figure 10:
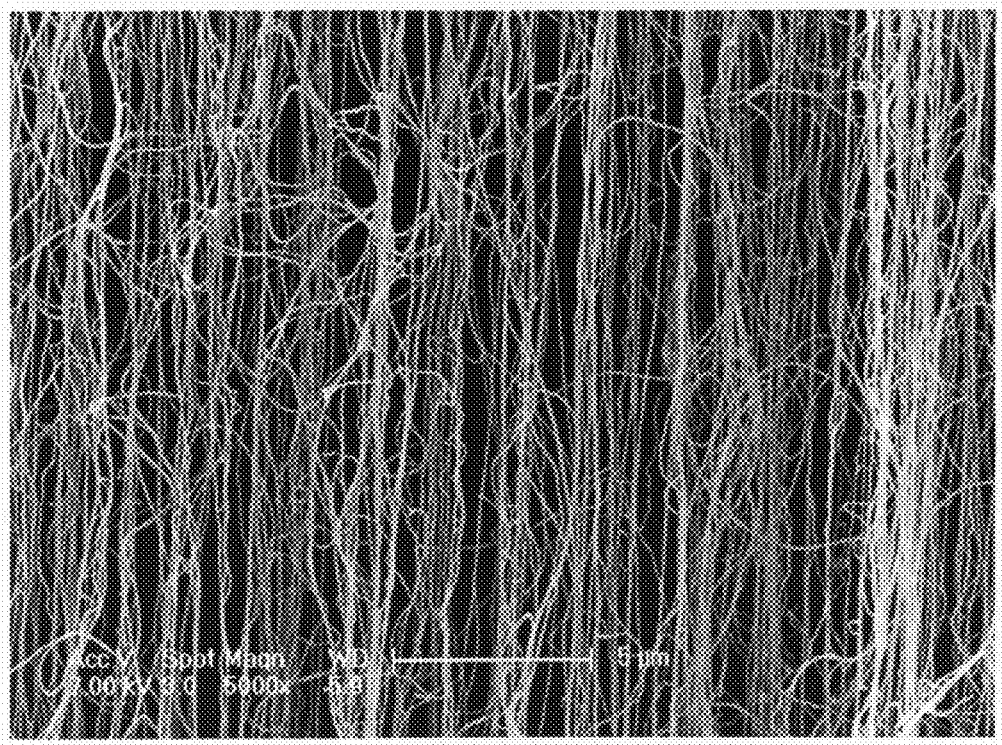
FIG. 10 is an SEM image of the nanowire structure having titanium deposited thereon shown by FIG. 9.
Figure 11:
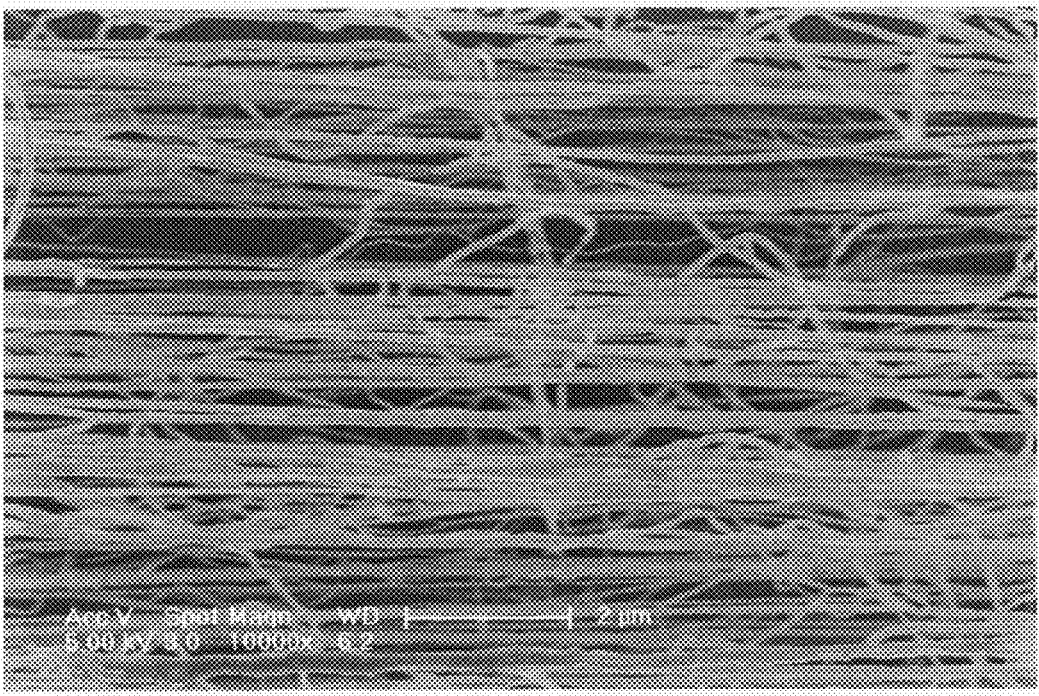
FIG. 11 is an SEM image of titanium dioxide nanowires that can be obtained in the embodiment shown by FIG. 9.
Figure 12:
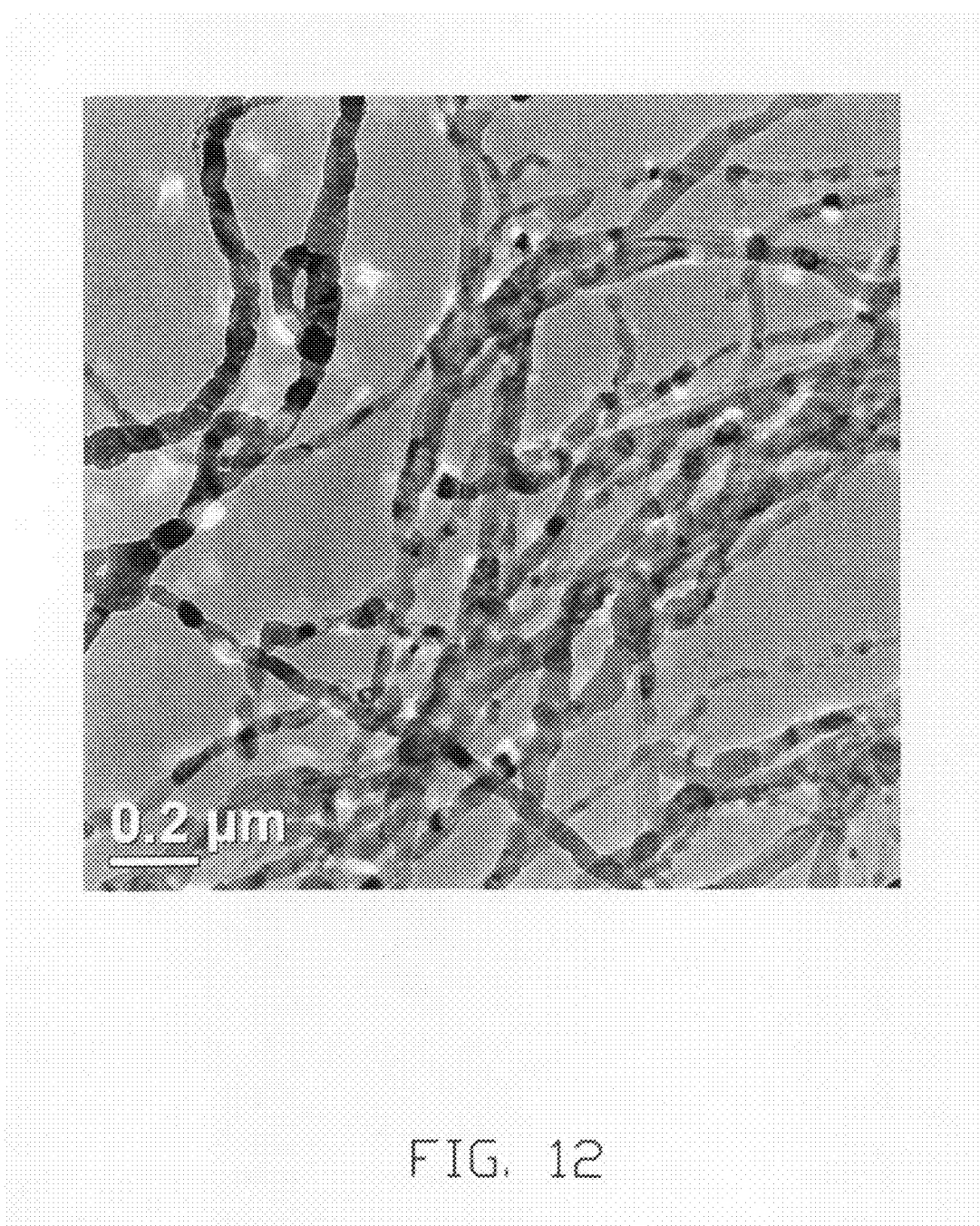
FIG. 12 is a transmission electron microscopy (TEM) image of titanium dioxide nanowires that can be obtained in the embodiment shown by FIG. 9.

In step (a2), a 100 nm thick titanium layer as reacting material 102 is sputtered on the carbon nanotube structure 100 by the magnetron sputtering method. Referring to FIGS. 10-12, the titanium particles of the titanium layer are uniformly distributed on the surface of the drawn carbon nanotube film.

In step (a3), the carbon nanotube structure 100 is placed in an atmospheric environment, the titanium particles come into contact with the oxygen of the atmosphere. A self-diffusion reaction is triggered to obtain a two-dimensional $TiO_2$ nanowire structure 104 by laser scanning the carbon nanotube structure 100. The $TiO_2$ nanowire structure 104 includes a plurality of substantially parallel titanium dioxide nanowires 106. The velocity of laser scanning can be about 10 centimeter to about 200 centimeter per second. Reacting materials 102 under the reaction conditions are in response to the growth of nanowire 106. In the present embodiment, the carbon nanotubes of the drawn carbon nanotube film utilized as the template are joined end-to-end by van der Waals attractive force therebetween and are substantially parallel to each other. The growth of nanowire 106 is substantially along the orientation of carbon nanotubes in the drawn carbon nanotube film. The carbon nanotubes are fully embedded inside of the nanowire 106. As such, a two dimensional nanowires structure 104 having a plurality of parallel nanowires 106 is obtained. The length of the nanowire 106 is equal to the length of the drawn carbon nanotube film. The micro-morphology of titanium dioxide nanowires 106 are plural consecutive spherical ellipsoids of similar small particles uniformly dispersed or coated on the surface of carbon nanotubes.

Figure 13:
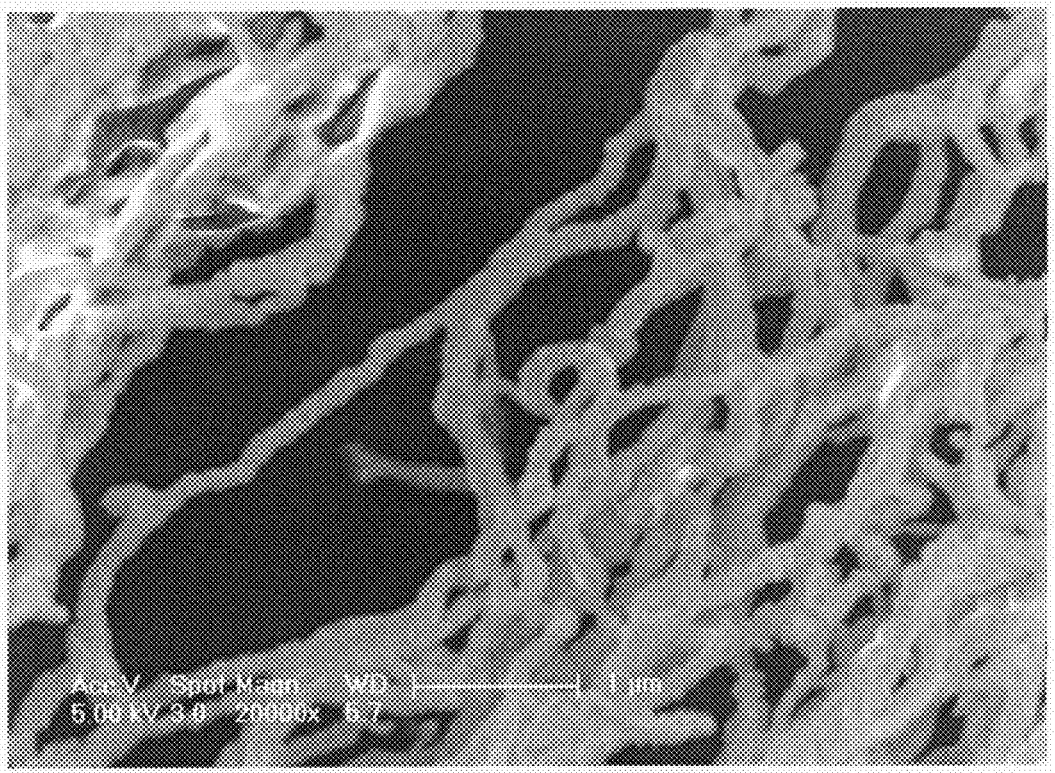
FIG. 13 is an SEM image of titanium dioxide nanowires shown by FIG. 11, wherein the CNT structure therein is removed.

Pure titanium dioxide nanowires can be obtained by removing the carbon nanotube structure 100 in a high-temperature oxidation process. The nanowire structure 104 is heated to about 900° C. in a heating rate of about 10 Kelvin/min. Referring to FIG. 13, the pure $TiO_2$ nanowires structure 104 is a free-standing film. The thickness of the pure $TiO_2$ nanowires structure 104 is less than 100 nm, the length is longer than 900 nm, and the diameter is less than 100 nm.

Example 2

Method for Manufacturing TiO2 Nanowires

Figure 14:
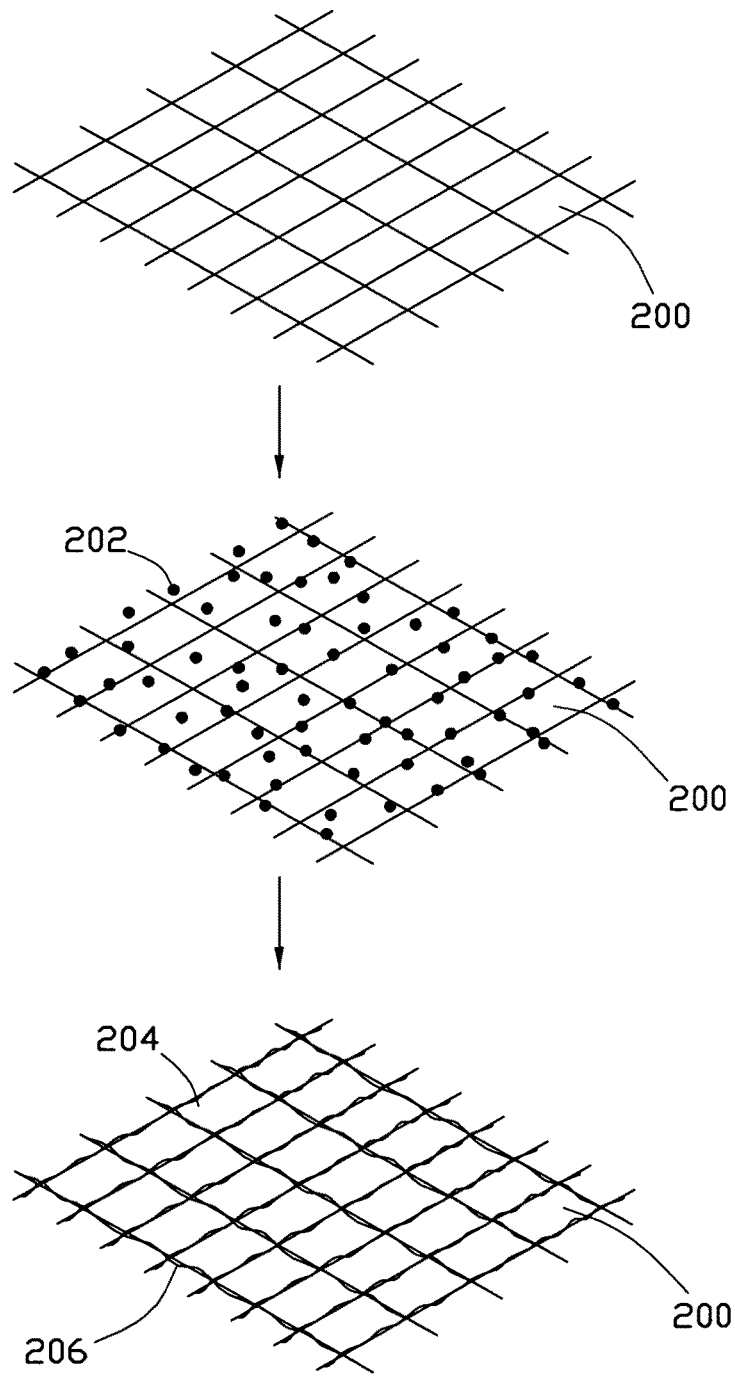
FIG. 14 shows a second embodiment of a method for fabricating a nanowire structure.

Referring to FIG. 14, in a second embodiment, a method of fabricating a $TiO_2$ nanowire structure 204 is similar to the first embodiment, differing only in the use of two stacked drawn carbon nanotube films. The discernable angle between two adjacent carbon nanotube films is about 90°.

The method of fabricating the $TiO_2$ nanowire nanostructure 204 includes (b1) providing a two dimension carbon nanotube structure 200, (b2) introducing reacting materials 202 into the carbon nanotube structure 200, and (b3) activating the reacting materials 202 to grow the $TiO_2$ nanowire nanostructure 204.

In step (b1), the two dimension carbon nanotube structure 200 is obtained by stacking two drawn carbon nanotube films. The carbon nanotubes of the two drawn carbon nanotube films are oriented along different directions. The discernable angle between two adjacent drawn carbon nanotube films is about 90°.

Figure 15:
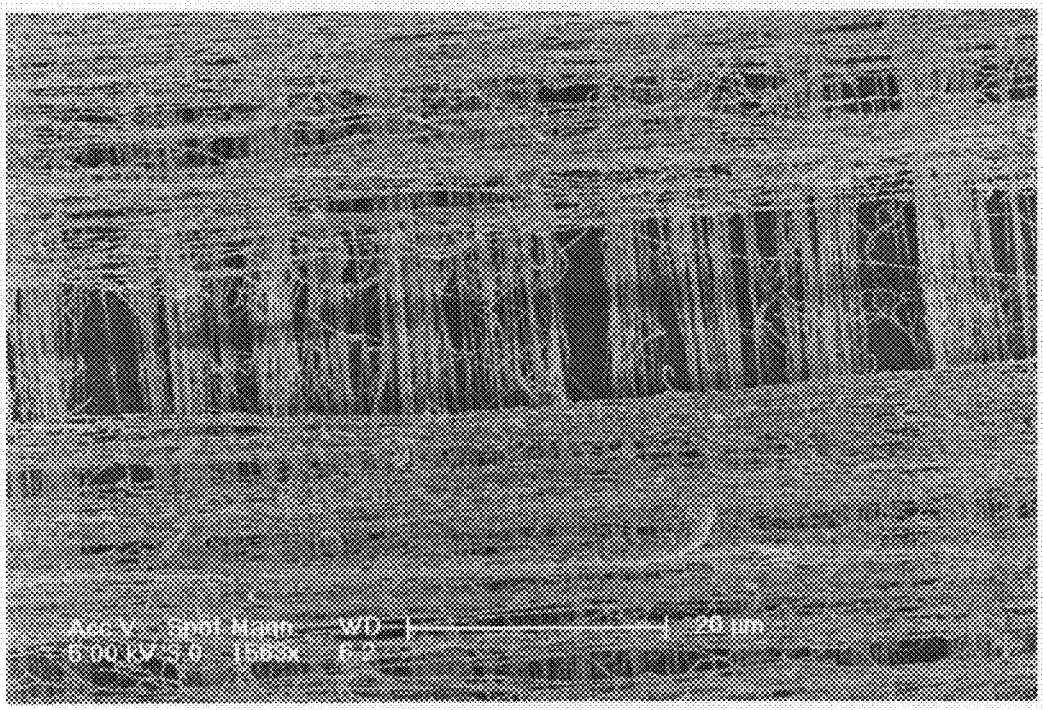
FIG. 15 is an SEM image of a nanowire structure having titanium deposited thereon that can be used in the embodiment shown by FIG. 14.

In step (b2), the reacting materials 202 are sputtered on the two surfaces of the carbon nanotube structure 200. The reacting material 202 is a 100 nm thick titanium layer sputtered by a magnetron sputtering method. Referring to FIG. 15, the titanium particles of the titanium layer are uniformly distributed on the two surfaces of carbon nanotube structure 200.

In step (b3), a reacting material 202 is activated to grow a $TiO_2$ nanowire structure 204. In the present embodiment, the carbon nanotubes of the drawn carbon nanotube films utilized as a template are oriented along different directions. The discernable angle between two adjacent drawn carbon nanotube films is about 90°. The nanostructure 204 includes a plurality of nanowires 206. The growth of nanowires 206 are substantially along the orientation of carbon nanotubes in the drawn CNT film. The carbon nanotubes are fully embedded inside the nanowires 206. As such, a two dimensional titanium dioxide nanostructure 204 is obtained. The micro-morphology of titanium dioxide nanowires 206 are plural consecutive spherical ellipsoids uniformly dispersed or coated on the surface of carbon nanotubes.

Example 3

Method for Manufacturing TiO2 Nanowires

Figure 16:
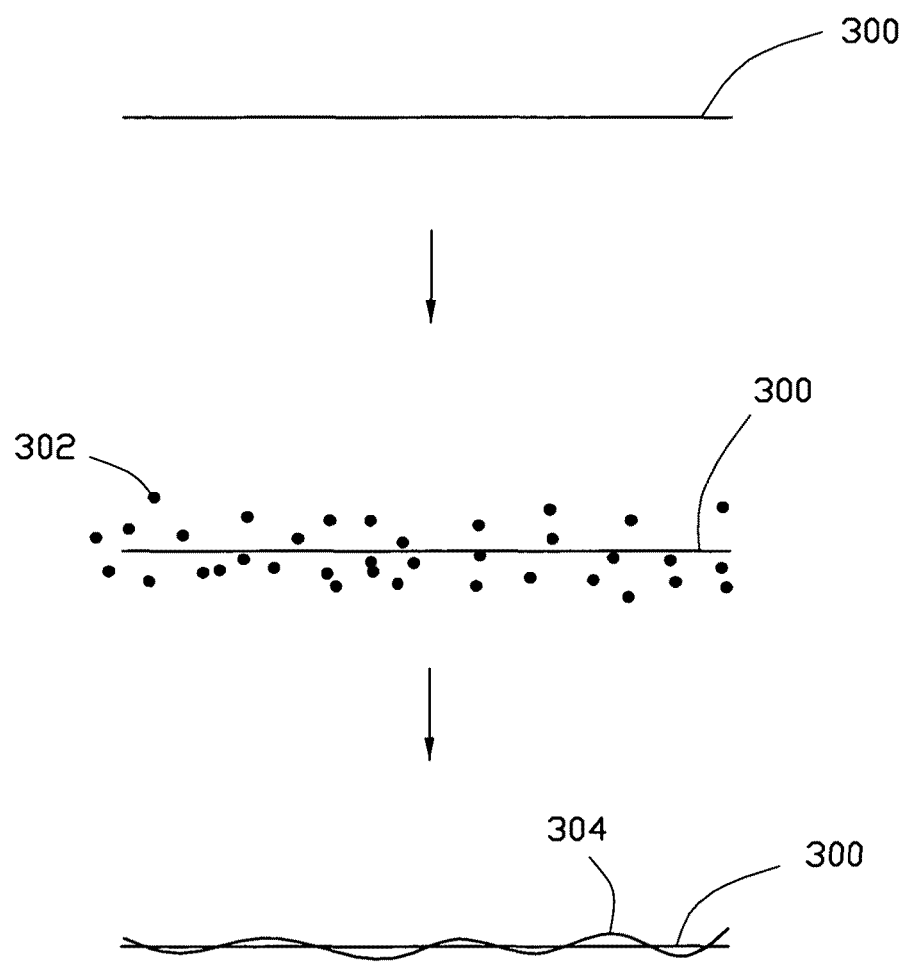
FIG. 16 shows a third embodiment of a method for fabricating a nanowire structure.

Referring to FIG. 16, in a third embodiment, a method of fabricating a $TiO_2$ nanowires structure 304 is similar to the first embodiment, differing only in the use of at least one carbon carbon nanotube wire as a template.

A method of fabricating the $TiO_2$ nanowires structure 304 includes the following steps of (c1) providing a one dimensional carbon nanotube structure 300, (c2) introducing reacting materials 302 into the carbon nanotube structure 300, and (c3) activating the reacting materials 302 to grow the $TiO_2$ nanowires structure 304.

In step (c1), the one dimensional carbon nanotube structure 300 can be one carbon nanotube wire or a plurality of carbon nanotube wires substantially parallel to each other. The diameter of the carbon nanotube wire is less than 100 nm. In one embodiment, the one dimensional carbon nanotube structure 300 includes a plurality of the carbon nanotube wire bundled together. Gaps of these carbon nanotube wires can be larger than 5 nm, growing the nanostructure therein. In one embodiment, the one dimensional carbon nanotube structure 300 includes one carbon nanotube wire with a diameter of about 50 nm.

In step (c2), titanium particles with diameters about 10 nm to about 50 nm are sputtered on the one dimensional carbon nanotube structure 300 by the magnetron sputtering method.

In step (c3), a reacting material 302 is activated to grow a nanowires structure 304. In the present embodiment, the carbon nanotubes of the carbon nanotubes wire utilized as a template are oriented along the same direction. The growth of nanowires structure 304 is substantially along the orientation of carbon nanotubes in the carbon nanotube wire. The carbon nanotubes are fully embedded inside of the nanowires structure 304.

Example 4

Method for Manufacturing TiO2 Nanowires

Figure 17:
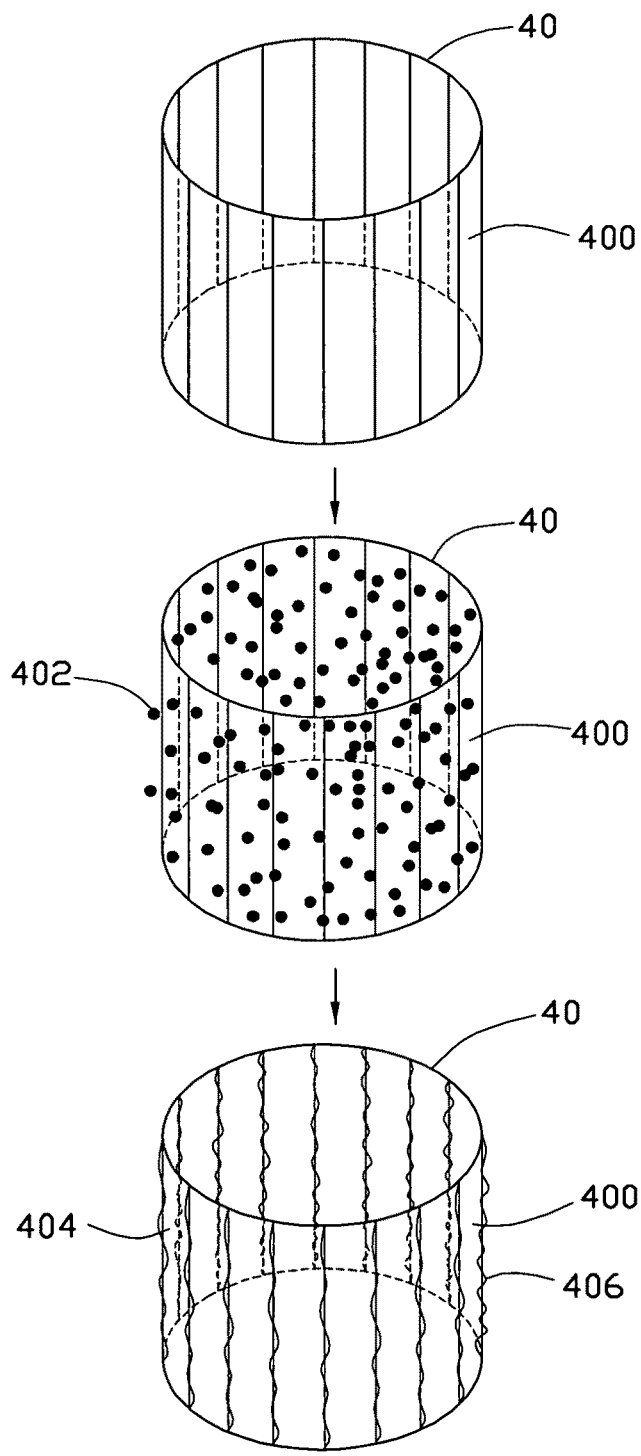
FIG. 17 shows a fourth embodiment of a method for fabricating a nanowire structure.

Referring to FIG. 17, in a fourth embodiment, a method of fabricating a $TiO_2$ nanowires structure 404 is similar to the first embodiment, differing only in the use of three dimensional carbon nanotube structure 400 to grow the $TiO_2$ nanowires structure 404.

A method of fabricating a $TiO_2$ nanowires structure 404 includes (d1) providing a three dimension carbon nanotube structure 400, (d2) introducing reacting materials 402 into the carbon nanotube structure 400, and (d3) activating the reacting materials 402 to grow a nanowires structure 404.

In step (d1), the flocculated carbon nanotube film, the pressed carbon nanotube film, or the drawn carbon nanotube film can be rolled up or folded into a three dimensional carbon nanotube structure 400 utilized as a template. In the present embodiment, the drawn carbon nanotube film is set on an aluminum framework rolled up to a coil cylinder.

In step (d2), a titanium layer 50 nm thick is sputtered on the carbon nanotube structure 400 by the magnetron sputtering method.

In step (d3), a reacting material 402 is activated to grow a $TiO_2$ nanowire nanostructure 404. The carbon nanotubes of the $TiO_2$ nanowire nanostructure 404 are joined end-to-end by van der Waals attractive force therebetween and are substantially parallel to each other. The growth of nanowires 406 are substantially along the orientation of carbon nanotubes in the drawn carbon nanotube film. The carbon nanotubes are fully embedded inside of the nanowire 406. As such, a three dimension $TiO_2$ nanostructure 404 having a plurality of parallel nanowire 406 is obtained.

Depending on the embodiment, certain of the steps described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

Finally, it is to be understood that the embodiments described are intended to illustrate rather than limit the invention. Variations may be made to the embodiments without departing from the spirit of the invention as claimed. The embodiments illustrate the scope of the invention but do not restrict the scope of the invention.

What is claimed is:

1. A method for fabricating a nanowire structure, the method comprising:
    providing a free-standing carbon nanotube structure used as a template;
    introducing at least two reacting materials into the carbon nanotube structure, wherein the introducing at least two reacting materials into the carbon nanotube structure comprises forming a first reacting material layer on a surface of the carbon nanotube structure, and forming a second reacting material layer on a surface of the first reacting material layer, wherein the total thickness of the first and second reacting material layers ranges from about 50 nanometers to about 200 nanometers; and
    activating the at least two reacting materials to grow the nanowire structure, wherein the activating the at least two reacting materials to grow the nanowire structure comprises laser scanning partial surface of the carbon nanotube structure so that the at least two reacting materials on the surface of the carbon nanotube structure have a diffuse reaction from a position where the laser has scanned.

2. The method as claimed in claim 1, wherein the carbon nanotube structure is selected from the group consisting of a carbon nanotube film structure, a linear carbon nanotube structure, and any combination thereof.

3. The method as claimed in claim 2, wherein the carbon nanotube film structure is a drawn carbon nanotube film comprising a plurality of carbon nanotubes which are oriented along a preferred orientation and joined end to end by van der Waals attractive forces.

4. The method as claimed in claim 2, wherein the carbon nanotube film structure is a pressed carbon nanotube film comprising a plurality of carbon nanotubes, an angle between a primary alignment direction of the carbon nanotubes and a surface of the pressed carbon nanotube film is about 0 degrees to about 15 degrees.

5. The method as claimed in claim 2, wherein the carbon nanotube film structure is a flocculated carbon nanotube film comprising a plurality of long, curved, disordered carbon nanotubes entangled with each other.

6. The method as claimed in claim 2, wherein the linear carbon nanotube structure comprises a plurality of the carbon nanotube wires substantially parallel to each other.

7. The method as claimed in claim 1, wherein the reacting materials are selected from the group consisting of metal, non-metal, semiconductor, and any combination thereof.

8. The method as claimed in claim 1, wherein a method of introducing at least two reacting materials into the carbon nanotube structure is selected from the group consisting of chemical vapor deposition, physical vapor deposition, impregnation method, spraying method, and silk-screen printing method.

9. The method as claimed in claim 1, wherein the first reacting material is a metal layer, and the second reacting material is a silicon layer or a metal layer.

10. The method as claimed in claim 1, further comprising removing the carbon nanotube structure by high-temperature oxidation.

11. The method as claimed in claim 10, wherein the nanostructure is placed at about 500° C. to about 1000° C. for about 1 hour to about 4 hours.

12. The method as claimed in claim 1, wherein the nanowire structure grows along a length direction of carbon nanotubes in the carbon nanotube structure.

13. The method as claimed in claim 1, wherein the providing a free-standing carbon nanotube structure comprises suspending the carbon nanotube structure.

14. The method as claimed in claim 1, wherein the providing a free-standing carbon nanotube structure comprises placing the carbon nanotube structure on a substrate.

15. A method for fabricating a nanowire structure, the method comprising:
    fabricating a suspended carbon nanotube structure, wherein the carbon nanotube structure comprises a plurality of carbon nanotubes arranged along the same direction and joined end to end by van der Waals attractive forces;
    coating a metal layer on the carbon nanotube structure and exposing the metal layer in oxygen gas; and
    oxidizing the metal layer to form a metal oxide nanowire structure, wherein the oxidizing the metal layer to form the metal oxide nanowire structure comprises laser scanning partial surface of the carbon nanotube structure so that the metal layer and the oxygen gas diffusely react along an arrangement direction of the plurality of carbon nanotubes from a position where the laser has scanned.

16. The method as claimed in claim 15, wherein the metal layer is in a range of about 50 nm to about 200 nm.

17. The method as claimed in claim 15, wherein the fabricating the suspended carbon nanotube structure comprises stacking a first carbon nanotube film on a second carbon nanotube film, the first carbon nanotube film comprising a plurality of first carbon nanotubes arranged along a first direction, the second carbon nanotube film comprising a plurality of second carbon nanotubes arranged along a second direction, and there is an angle defined between the first direction and the second direction that is about 90°.

* * * * *